(12) United States Patent
Bertanzetti

(10) Patent No.: US 8,689,067 B1
(45) Date of Patent: *Apr. 1, 2014

(54) CONTROL OF CLOCK GATE CELLS DURING SCAN TESTING

(71) Applicant: Marvell International Ltd., Hamilton (BM)

(72) Inventor: Darren Bertanzetti, Thornton, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,700

(22) Filed: May 13, 2013

Related U.S. Application Data

(63) Continuation of application No. 13/014,921, filed on Jan. 27, 2011, now Pat. No. 8,443,246, which is a continuation of application No. 11/765,275, filed on Jun. 19, 2007, now Pat. No. 7,895,488.

(60) Provisional application No. 60/818,835, filed on Jul. 6, 2006.

(51) Int. Cl.
*G01R 31/28* (2006.01)
*G06F 11/00* (2006.01)
*G01R 31/02* (2006.01)
*G01R 31/26* (2006.01)

(52) U.S. Cl.
USPC ............... 714/728; 714/25; 714/30; 714/724; 714/726; 714/729; 714/731; 714/739; 324/537; 324/762.01; 324/762.02; 324/762.03; 324/762.05

(58) Field of Classification Search
USPC ............... 714/25, 30, 41, 724, 726, 727, 729, 714/731, 733, 739; 324/537, 762.01, 324/762.02, 762.03, 762.05
See application file for complete search history.

(56) References Cited

U.S. PATENT DOCUMENTS

| | | |
|---|---|---|
| 7,058,868 B2 | 6/2006 | Guettaf |
| 7,134,061 B2 | 11/2006 | Agashe et al. |
| 7,200,784 B2 | 4/2007 | Dervisoglu et al. |
| 7,383,481 B2 | 6/2008 | Warren et al. |
| 7,482,851 B2 | 1/2009 | Lackey et al. |
| 7,543,204 B2 | 6/2009 | Fredrickson et al. |
| 2001/0052096 A1 | 12/2001 | Huijbregts |
| 2005/0283696 A1 | 12/2005 | Warren et al. |

*Primary Examiner* — John J Tabone, Jr.

(57) ABSTRACT

A system and method for detecting transition delay faults decouples the test enable pins of the clock gating cells from other elements in the circuitry. The test enable pins are controlled during test mode by a unique signal, allowing the tester to independently control the clock gating logic of the circuitry. By being able to ungate the clock, the tester can ensure that the two clock pulses needed to check for transition delay faults will always be present.

20 Claims, 7 Drawing Sheets

CONTROL OF CLOCK GATE CELLS DURING SCAN TESTING

CROSS REFERENCE TO RELATED APPLICATION

This application is a continuation of U.S. application Ser. No. 13/014,921, filed Jan. 27, 2011, now U.S. Pat. No. 8,443,246, which is a continuation of U.S. application Ser. No. 11/765,275, filed Jun. 19, 2007, now U.S. Pat. No. 7,895,488, which claims the benefit of provisional application Ser. No. 60/818,835, filed on Jul. 6, 2006. The disclosures of the applications referenced above are incorporated herein by reference.

FIELD OF THE INVENTION

The present invention relates to a method for controlling clock gating during integrated circuit testing.

BACKGROUND

Integrated circuits can undergo various tests. One such test detects Transition Delay Faults (TDFs) which result from the finite rise and fall times of the signals in the gates and from the propagation delays because of interconnects between the gates. Circuit timing and circuit propensity for TDFs need to be evaluated carefully to avoid errors in operation, and to determine the maximum clock frequency at which the circuit can operate.

As integrated circuits have become smaller, significantly faster, and more complicated, testing for TDFs has become more complicated. One of the principal reasons stems from the use of layers of clock gating logic, which decreases power consumption in the circuit by disabling portions of circuitry, for example, when flip flops are not changing states.

Most integrated circuits are capable of operating in a test mode that is distinct from the functional mode. FIG. 1 shows two flip flops 110 and 130 with circuitry, referred to for convenience as combinational logic 120, connected between them. The combinational logic 120 can be any number of things, depending on the functionality of the circuit, as known to those of working skill in the art. A circuit may have tens or even hundreds of thousands of circuit combinations like the one shown in FIG. 1.

In test mode, an automatic test pattern generator (ATPG) 140 can be used to shift known data into the flip flops 110 and 130. The ATPG 140 provides pseudorandom data, so as to permit exercising of the combinational logic 120 in a variety of ways. Because the combinational logic 120 is known, the outputs for a given set of inputs are predictable. This process of shifting data into the circuit sometimes is referred to as scan shifting. As an example of what may occur during test mode, the ATPG 140 may shift data into the first flip flop 110 so that the value at the output 114 of flip flop 110 will be known. The ATPG 140 may shift in data that results in a 1 being present at input 112 and a 0 being present at output 114. When the 0 at output 114 goes through the combinational logic 120, it may result in a 0 being present at input 132 of flip flop 130. After the data is shifted in, the circuit is put into capture mode and pulsed twice at normal operating frequency. The first pulse causes the 1 at input 112 of the first flop 110 to shift to the output 114. When the output 114 of the first flip flop 110 goes through the combinational logic 120 it may put a 1 at the input 132 of flip flop 130. The 0 previously at input 132 then shifts to output 134. On the second pulse, the 1 at input 132 shifts to output 134. The objective of this procedure is to cause every flip flop to go from 1 to 0 and 0 to 1 so that the TDFs can be detected.

FIG. 2a shows a portion of a conventional circuit containing clock gating logic. The portion of the circuit shown in FIG. 2a typically would be part of a larger circuit which might be under the control of a clock 250. Various aspects of the circuit's functionality can be tested by using an ATPG 240 to input pseudorandom data into the circuit during scan testing. The goal of scan testing is to use all the flip flops in the circuit in a way that allows errors to be detected. In the circuit of FIG. 2a, test enable (TE) ports 212 and 222 of clock gating cells 210 and 220 are connected to a test scan enable (TEST_SE) signal, which is controlled by the Tester Pin #1 260, when Scan Mode is active. The TEST_SE signal is also connected to the select input 236 of a Scan Flip-Flop 230. When the TEST_SE signal is held high, as it is during scan shifting, the clock is ungated and the Scan_IN (SI) input 232 on the Scan Flip-Flop 230 is selected. When the TEST_SE signal is held low, the clock is gated, and the functional input (D) 234 of the Scan Flip-Flop 230 is selected.

One known method of testing for TDFs involves shifting test data in while the TEST_SE signal is high. When shifting data in, it is common to clock the circuit at a lower frequency than the frequency used for normal operation. For example, a circuit that normally would function at 200 MHz might be clocked at 100 MHz during scan shifting. After the test data is shifted in, the TEST_SE signal is held low during the capture sequence so that the circuit can operate as if it were in functional mode. During the capture sequence, the clock will be pulsed twice at the normal operating frequency. After the capture sequence, the TEST_SE pin is then held high again while the test data is shifted out. The test data can then be compared to expected data in order to verify the correct functioning of the circuit.

FIGS. 3a-d provides a graphical representation of the TEST_SE signal and Clock signal during testing mode. During scan shifting (the load/unload phase) 310, test data is shifted into the circuit. This is done while the TEST_SE signal is held high, ungating the clock, and while the clock is being pulsed at a frequency lower than its normal operating frequency. Once the desired test data has been shifted in, the circuit enters capture mode 320, where TEST_SE is held low and the clock is pulsed at its normal operating frequency. After the circuit has been pulsed at normal speed, the circuit reenters scan shifting mode 330 so that the test data can be shifted out and compared to expected results. In a typical circuit, the shifting in of new data and shifting out of old data occurs simultaneously.

In this method of testing for TDFs, because the TEST_SE signal is held low during the capture sequence, the clock gating will depend on the pseudorandom data being entered at the EN ports 214 and 224. As FIGS. 3a-d illustrate, there are four possible combinations of clock pulses. Either both clock pulses will be low (FIG. 3a); the first pulse will be high while the second pulse is low (FIG. 3b); the first pulse will be low while the second pulse is high (FIG. 3c); or both will be high (FIG. 3d). Which of these combinations occurs in the circuitry depends on the pseudorandom data entered at the EN ports 214 and 224.

Two pulses at the operating frequency of the circuit are needed during the capture sequence in order to capture TDFs. One pulse is needed to setup a transition delay rise (i.e. going from 0 to 1), and a second pulse is needed to catch a transition delay fall (i.e. going from 1 to 0). For a simple circuit with only two gating cells, like the one shown in FIG. 2a, each cell must receive a 11 signal in order to pulse the clock twice. Therefore, a one-in-sixteen chance exists that the two clock pulses needed to capture the TDFs will be present at each clock gating cell (one-fourth probability that both pulses will be high at each gating cell; hence the one-in-sixteen chance). It can be seen that, for each additional gating cell added to the circuit, the probability of capturing the TDFs decreases exponentially. Most modern circuits now contain so many layers of clock gating cells that generating pseudorandom data capable of capturing all the TDFs is virtually impossible.

An alternate method for testing the circuit, as shown in FIG. 2b, is to connect the TE ports 212 and 222 of the clock gating cells 210 and 220 to scan mode, which ungates the clock and always generates the two clock pulses needed to test for TDFs. A limitation of this method, however, is that TDFs in the EN ports of the clock gating circuitry will not be captured. To increase TDF coverage, the TE ports on the clock gating cells 210 and 220 need to be easily controlled to allow two or more clock pulses during capture cycles and to also be able to observe the TDFs on the EN ports of the clock gating cell.

SUMMARY OF THE INVENTION

In view of the foregoing, in accordance with one embodiment of the invention, the TE pins of the clock gating cells are decoupled from other elements in the circuitry and controlled during test mode by a unique signal. This decoupling allows the tester to independently control the clock gating logic of the circuitry. By being able to ungate the clock, the tester can ensure that the two clock pulses needed to check for TDFs will always be present.

DETAILED DESCRIPTION

Figure 1:
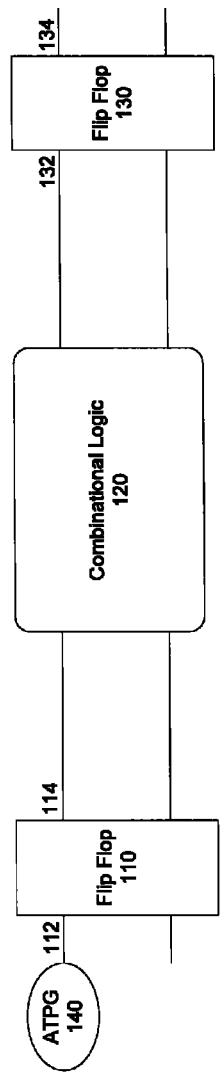
FIG. 1 shows two flip flops connected by combinational logic.
Figure 2A:
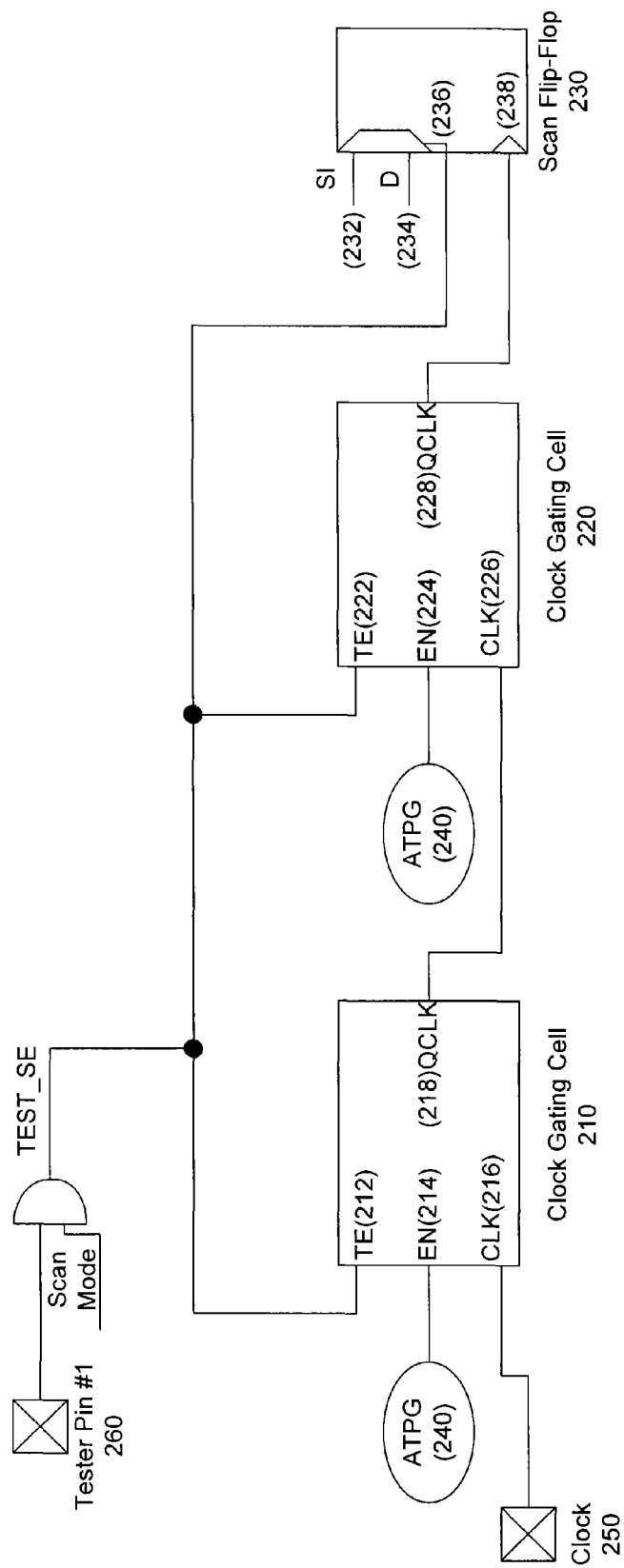
FIGS. 2a-b show known configurations for testing a circuit with clock gating circuitry for TDFs.
Figure 2B:
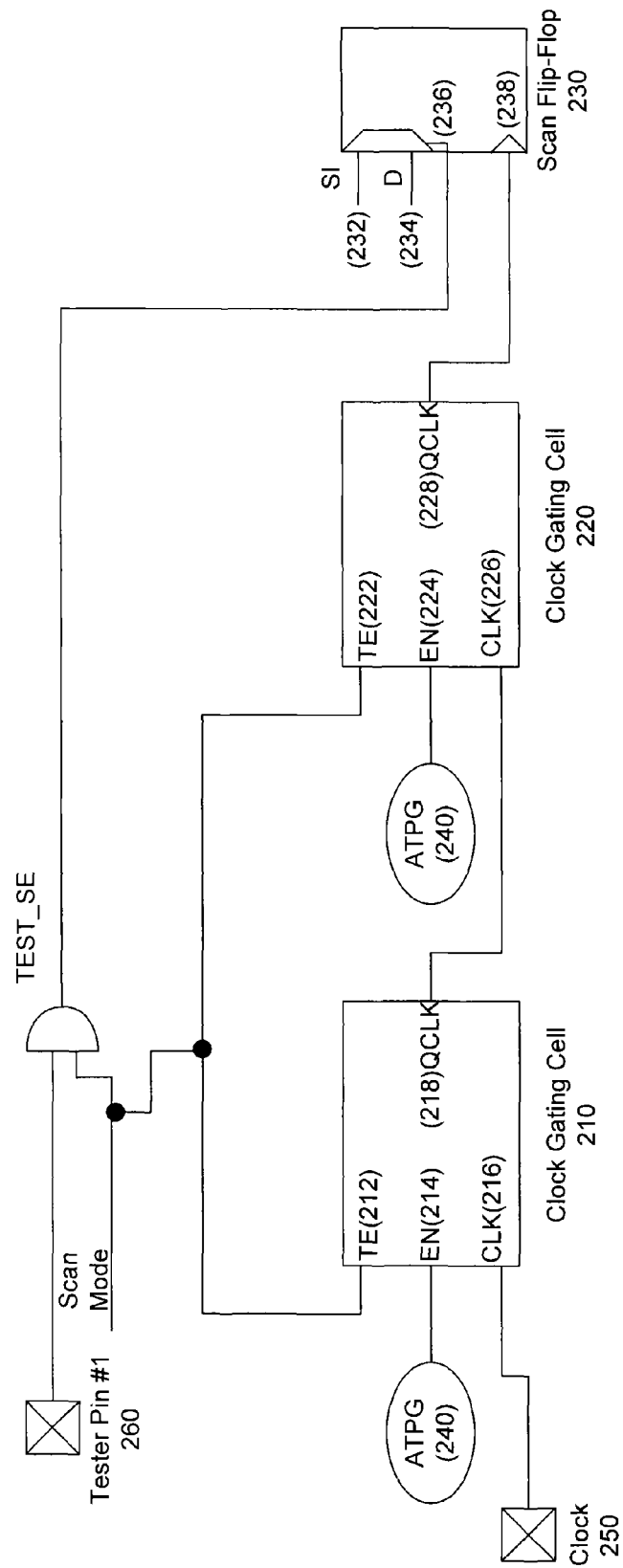
Figure 3A:
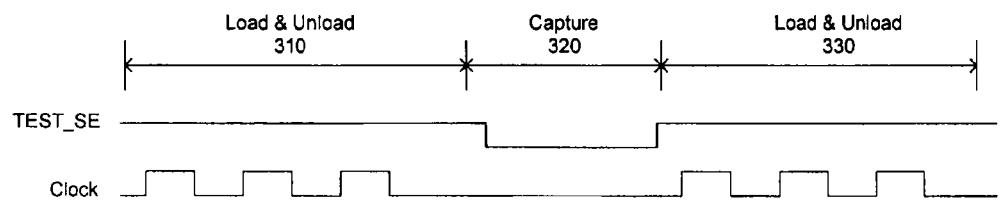
FIGS. 3a-d show graphical representations of the TEST_SE and Clock signals during test mode for the configuration of FIG. 2.
Figure 3B:
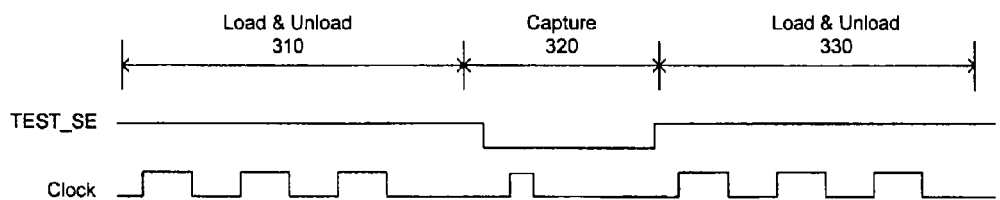
Figure 3C:
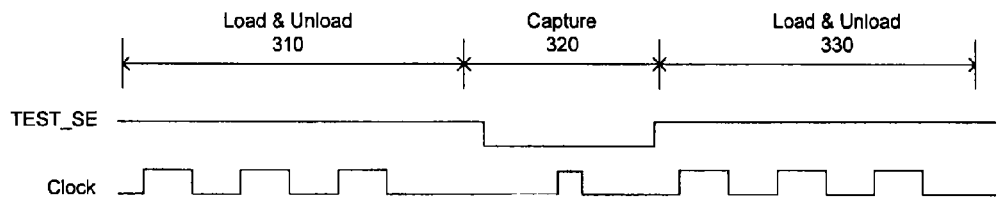
Figure 3D:
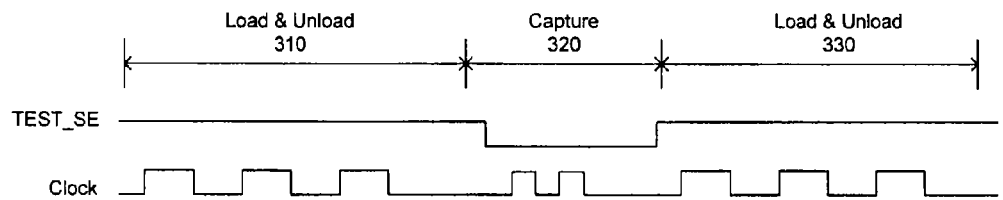
Figure 4:
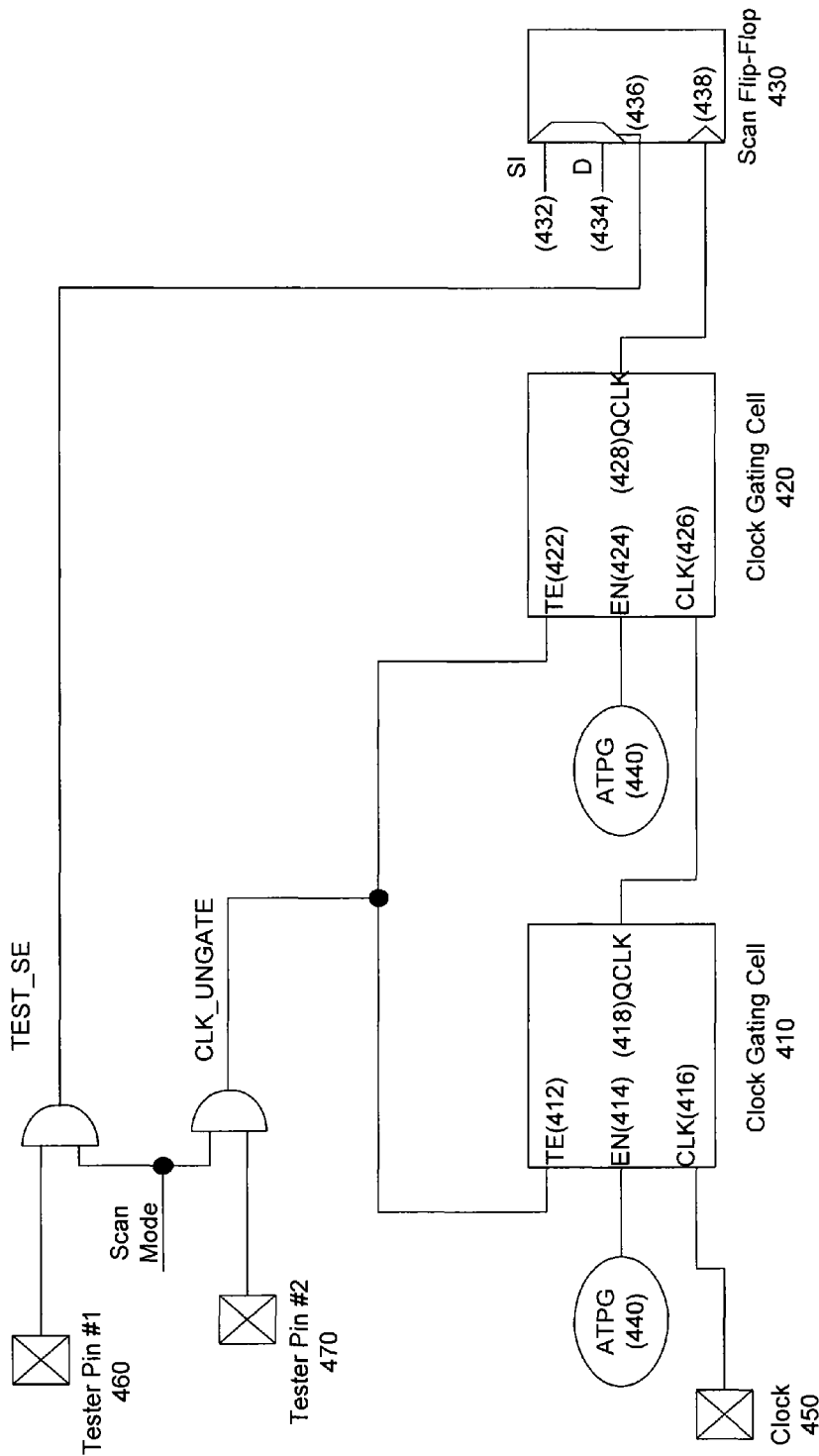
FIG. 4 shows an embodiment of the present invention with the clock gating cells being controlled by an independent signal.

FIG. 4 shows an illustrative embodiment of the present invention. As with the conventional circuit of FIG. 2, FIG. 4 shows two clock gating cells 410 and 420 that comprise a portion of a larger digital synchronous circuit synchronized by a clock 450. Each clock gating cell 410 and 420 contains a TE port 412 and 422, an EN port 414 and 424, and a CLK port 416 and 426, respectively. An ATPG 440 feeds pseudorandom data into the EN ports 414 and 424. The TEST_SE signal is still fed into the input select 436 of the Scan Flip-Flop 430, but it is not fed into the TE ports 412 and 422 of the clock gating cells 410 and 420. Instead, an additional, separate signal, CLK_UNGATE, is connected to the TE ports 412 and 422 of the clock gating cells 410 and 420. By uncoupling the TE ports 412 and 422 and the input select 436 of the Scan Flip-Flop 430, the clock can be gated or ungated independently of the input select 436 on the Scan Flip-Flop 430. This gives the tester full control of the clock gating while in test mode, thus allowing for the two clock pulses needed to capture the majority of TDFs to always be present during the capture sequence.

Figure 5:
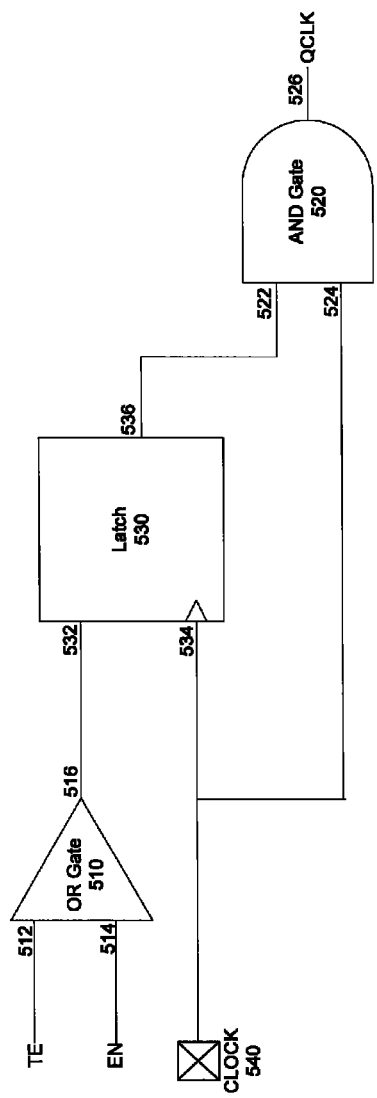
FIG. 5 shows a schematic of clock gating circuitry.

FIG. 5 shows one embodiment of a typical clock gating cell such as elements 410 and 420 of FIG. 4. The Test_Enable (TE) port 512 and the Enable (EN) port 514 of a gating cell are both inputs of an OR gate 510. If either the signal at the TE input 512 or the EN input 514 is high, then the output 516 of the OR gate 510 will also be high. Only when both the TE input 512 and EN input 514 are low will the output 516 of the OR gate 510 be low. The output 516 of the OR gate 510 is then fed into the input 532 of a negative edge latch 530. The Clock signal (CLK) 540 is also connected to the latch 530 at a negative input 534. Therefore, because the CLK 540 starts off low, if output 516 is high, then the output 536 of the latch 530 will be high as well. The output 536 of the latch 530 connects to the first input 522 of an AND gate 520, and the CLK 540 connects to the second input 524. The output 526 of the AND gate 520, referred to as QCLK in FIG. 4, is the clock signal as propagated by the gating logic.

In accordance with one embodiment of the present invention, the TE input 512 may be independently controlled by a new signal, the CLK_UNGATE signal, separate from the TEST_SE signal. Referring back to FIG. 2a, in one known method of testing circuits, the select input 236 of the Scan Flip-Flop 230 and the TE ports 212 and 222 on the clock gating cells 210 and 220 are coupled to the same signal, the TEST_SE signal. In capture mode, the TEST_SE signal is going to be low so that the select input 236 of the Scan Flip-Flop 230 will select the functional (D) input 234. If the TEST_SE signal were also connected to the TE port 512, then the clock gating circuitry would be driven by the pseudorandom data being input at the EN port 514. By connecting the TE input 512 to the CLK_UNGATE signal instead, the tester of the chip will be able to ungate the CLK 540 independent of the EN input 514 (i.e. the data from an ATPG as shown in FIG. 4) and independent of the select input 436 of the Scan Flip-Flop 430. If CLK_UNGATE is high, then the output 516 of the OR gate 510 will also be high, regardless of the signal at the EN input 514. If the output 516 of the OR gate 510 is always high, then the output 536 of the latch 530 will likewise always be high, meaning the input 522 of the AND gate 520 will also always be high. If the first input 522 of the AND gate 520 is always high, then the output 526 of the AND gate 520, will be entirely dependent on the second input 524 which is connected to the CLK 540. When the CLK 540 is low, the output 526 of the AND gate 520 will be low, and when the CLK 540 is high, the output 526 of the AND gate 520 will also be high. Therefore, the QCLK 418 will be the same as the CLK 540, i.e. the clock is not gated.

Figure 6A:
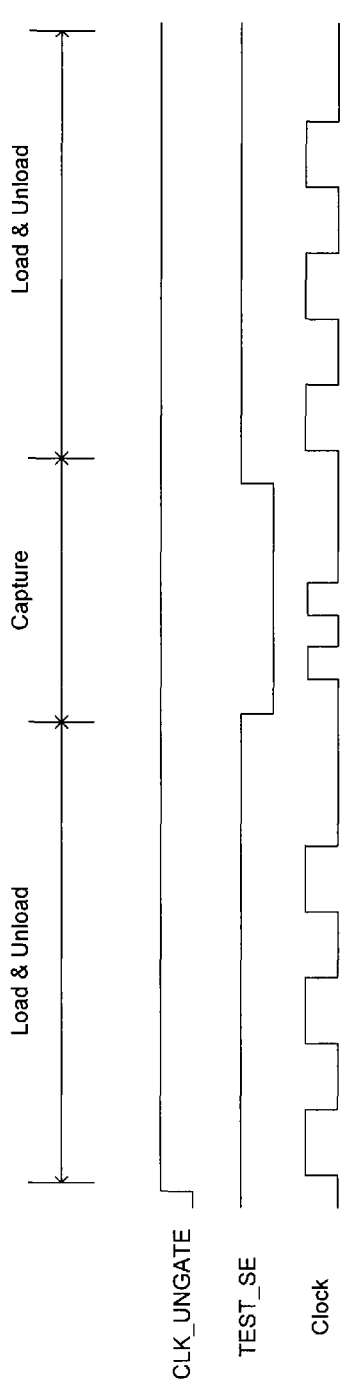
FIGS. 6a-b show a graphical representation of the CLK_UNGATE, TEST_SE, and Clock signals during test mode in an embodiment of the current invention.

FIG. 6a provides a graphical representation of the CLK_UNGATE, TEST_SE, and Clock signals during test mode. If the CLK_UNGATE signal is high, then the clock is ungated and the two clock pulses needed to capture a majority of TDFs will always be present during the capture sequence. The clock pulses are no longer dependent on the pseudorandom data being input by the ATPG 440.

Figure 6B:
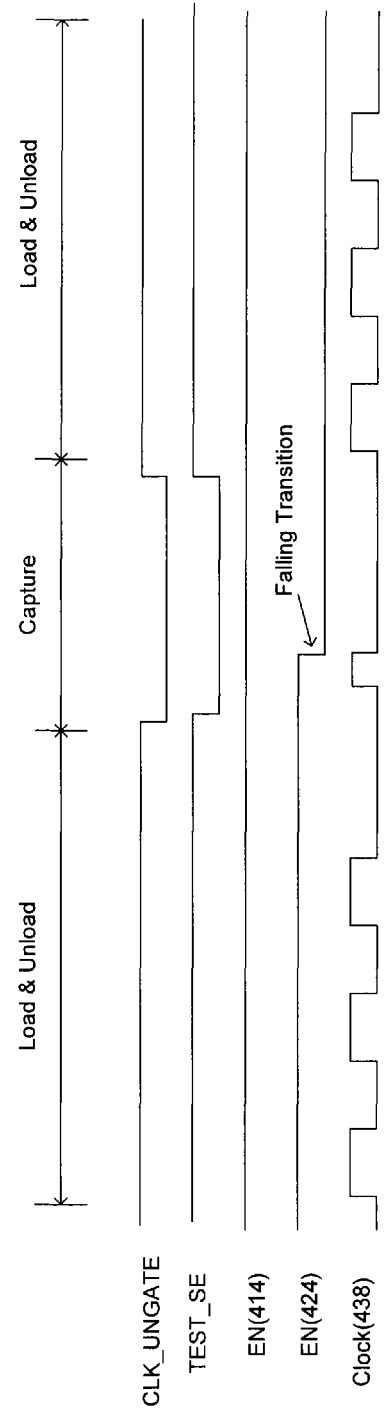

FIG. 6b provides a graphical representation of the CLK_UNGATE, TEST_SE, and Clock signals when testing for TDFs associated with the EN ports 414 and 424 of the clock gating cells 410 and 420. FIG. 6b specifically shows the signals when testing for a falling transition delay fault on EN 424. One of working skill in the art will appreciate that the same technique can be used to test for transition delay faults in other clock gating cells within the gating circuitry.

In the described embodiment, CLK_UNGATE is held high during load_unload. To catch the EN fault, CLK_UNGATE should be low during capture. For the falling transition delay fault, EN 424 should be 1 for the load and 0 for capture, producing one clock pulse. The clock will be gated for one clock pulse and not gated for the other, meaning that one clock pulse will propagate to the clock input 438 on the Scan Flip-Flop 430. The clock pulse will change the data on the Scan Flip-Flop 430 and can be observed when the data is unloaded. If the transition fails, then a 1 will be present for both load and capture, meaning that two clock pulses will propagate to the clock input 438 on the Scan Flip-Flop 430.

To catch the rising transition fault on an EN port 414 or 424, EN should be 0 for load and 1 for capture. If there was a transition fault on the EN port 424, then 0 will be there for both load and capture. Then there would be no clock pulse, and the data on the Scan Flip-Flop 430 would not change. Whether testing for rising or falling transition faults, the test is looking for one clock pulse and a change to the data on the Scan Flip-Flop 430. If there are no clock pulses or there are two clock pulses, then a transition delay fault occurred.

The previous description of embodiments is provided to enable a person skilled in the art to make and use the present invention. Various modifications to these embodiments will be readily apparent to those skilled in the art, and the generic principles and specific examples defined herein may be applied to other embodiments without the use of inventive faculty. For example, some or all of the features of the different embodiments discussed above may be deleted from the embodiment. Therefore, the present invention is not intended to be limited to the embodiments described herein but is to be accorded the widest scope defined only by the claims below and equivalents thereof.

What is claimed is:

1. A circuit operating in at least a test mode, the circuit comprising:
    clock gating circuitry configured to receive a clock signal, a pseudorandom test pattern, and a first signal, wherein
        the first signal controls the clock gating circuitry so that the clock signal propagates through the clock gating circuitry when the circuit operates in the test mode, and
        the clock gating circuitry prevents propagation of the clock signal as a function of the pseudorandom test pattern during the test mode; and
    a shift register receiving a second signal and the propagated clock signal when the circuit operates in the test mode.

2. The circuit of claim 1, wherein the clock gating circuitry includes at least one clock gating cell, the at least one clock gating cell has two signal inputs, a clock input, and an output.

3. The circuit of claim 2, wherein the first signal and the pseudorandom test pattern form the two signal inputs, which are input to an internal OR gate of the at least one clock gating cell.

4. The circuit of claim 2, wherein the output of the at least one clock gating cell is input to a clock input of a further clock gating cell or a clock input of the shift register.

5. The circuit of claim 3, wherein an output of the internal OR gate is input to a latch and the clock signal is input to a clock input of the latch.

6. The circuit of claim 5, wherein a latch output and the clock signal are input to an AND gate, and an output of the AND gate is an output of the at least one clock gating cell.

7. The circuit of claim 1 further comprising:
    testing circuitry configured to generate the first signal and the second signal.

8. The circuit of claim 7, wherein the testing circuitry generates a scan mode signal as a first input of a first AND gate and a first input of a second AND gate.

9. The circuit of claim 8, wherein the testing circuitry further generates two external signal inputs, a first external signal input to a second input of the first AND gate, and a second external signal input to a second input of the second AND gate.

10. The circuit of claim 9, wherein an output of the first AND gate is the first signal, and an output of the second AND gate is the second signal.

11. A method of operating a circuit in at least a test mode, the method comprising:
    receiving a clock signal, a pseudorandom test pattern, and a first signal by clock gating circuitry;
    controlling the clock gating circuitry by the first signal to propagate the clock signal through the clock gating circuitry when the circuit operates in the test mode;
    preventing propagation of the clock signal as a function of the pseudorandom test pattern during the test mode by the clock gating circuitry; and
    receiving a second signal and the propagated clock signal when the circuit operates in the test mode by a shift register.

12. The method of claim 11 further comprising:
    receiving two signal inputs and a clock input by at least one clock gating cell of the clock gating circuitry; and
    generating an output by the at least one clock gating cell.

13. The method of claim 12 further comprising:
    forming the two signal inputs as input to an internal OR gate of the at least one clock gating cell by the first signal and the pseudorandom test pattern.

14. The method of claim 12 further comprising:
    feeding the output of the at least one clock gating cell as an input to a clock input of a further clock gating cell or a clock input of the shift register.

15. The method of claim 13 further comprising:
    generating an output of the internal OR gate as an input to a latch; and
    receiving the clock signal as a clock input to the latch.

16. The method of claim 15 further comprising:
    generating an output of the latch and feeding the output of the latch and the clock signal as an input to an AND gate; and
    generating an output of the AND gate as an output of the at least one clock gating cell.

17. The method of claim 11 further comprising:
    generating the first signal and the second signal by testing circuitry.

18. The method of claim 17 further comprising:
    generating a scan mode signal and feeding the scan mode signal as a first input of a first AND gate and a first input of a second AND gate.

19. The method of claim 18 further comprising:
    generating a first external signal as a second input of the first AND gate; and
    generating a second external signal as a second input of the second AND gate.

20. The method of claim 19 further comprising:
    generating an output of the first AND gate as the first signal; and
    generating an output of the second AND gate as the second signal.

* * * * *